US007587645B2

(12) United States Patent
Chang et al.

(10) Patent No.: US 7,587,645 B2
(45) Date of Patent: Sep. 8, 2009

(54) INPUT CIRCUIT OF SEMICONDUCTOR MEMORY DEVICE AND TEST SYSTEM HAVING THE SAME

(75) Inventors: Young-Uk Chang, Gyeonggi-do (KR); Sang-Woong Shin, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 316 days.

(21) Appl. No.: 11/690,092

(22) Filed: Mar. 22, 2007

(65) Prior Publication Data

US 2007/0234165 A1 Oct. 4, 2007

Related U.S. Application Data

(63) Continuation-in-part of application No. 11/336,331, filed on Jan. 20, 2006, now Pat. No. 7,516,384.

(30) Foreign Application Priority Data

Jul. 24, 2006 (KR) ..................... 10-2006-0069300

(51) Int. Cl.
*G01R 31/28* (2006.01)

(52) U.S. Cl. ............................ 714/738; 714/5; 714/42; 714/702; 714/703; 714/715; 714/718; 714/720; 714/735; 714/742; 714/824; 365/200; 365/201

(58) Field of Classification Search ...................... None
See application file for complete search history.

(56) References Cited

U.S. PATENT DOCUMENTS 6,400,625 B2 6/2002 Arimoto et al.
6,456,561 B2 9/2002 Maeda
6,519,726 B1 * 2/2003 Shibata ...................... 714/718
6,868,707 B2 3/2005 Nishi et al.
6,880,117 B2 * 4/2005 Lin et al. .................... 714/718

(Continued)

FOREIGN PATENT DOCUMENTS

JP 05-180906 7/1993

(Continued)

OTHER PUBLICATIONS

English language abstract of Korean Publication No. 1998-082682.

(Continued)

*Primary Examiner*—John P Trimmings
(74) *Attorney, Agent, or Firm*—Marger Johnson & McCollom, P.C.

(57) ABSTRACT

An input circuit of a semiconductor memory device includes a data input circuit and a data pattern setting circuit. The data input circuit receives first data, and generates second data by buffering the first data, sampling buffered first data responsive to a write data strobe (WDQS) signal, and parallelizing sampled data. The data pattern setting circuit sets a pattern of the second data responsive to a test mode signal and a data pattern select signal to generate third data. Accordingly, the semiconductor memory device including the input circuit may generate data of various patterns in a test mode, and may perform a high-speed test using a low-speed tester.

39 Claims, 10 Drawing Sheets

U.S. PATENT DOCUMENTS 7,200,059 B2 * 4/2007 Fujioka et al. .............. 365/201
7,257,754 B2 * 8/2007 Chae et al. .................. 714/738
7,325,173 B2 * 1/2008 Kikutake et al. ............ 714/703
7,335,908 B2 * 2/2008 Samuelson et al. ............ 257/12
7,365,557 B1 * 4/2008 Ong ........................... 324/765
7,404,116 B2 * 7/2008 Wang ......................... 714/718
2002/0157052 A1 10/2002 Ernst et al.
2003/0031082 A1 * 2/2003 Sawada ...................... 365/233
2003/0070118 A1 4/2003 Nakao et al.
2003/0233604 A1 12/2003 Lin et al.
2004/0061560 A1 4/2004 Kwon et al.
2004/0100839 A1 * 5/2004 Kim et al. ................... 365/201
2004/0139376 A1 7/2004 Ohta et al.
2004/0181637 A1 * 9/2004 Watanabe ................... 711/154
2004/0205437 A1 10/2004 Yao et al.
2004/0239310 A1 12/2004 Oshima et al.
2005/0057988 A1 3/2005 Cordes et al.

FOREIGN PATENT DOCUMENTS

JP 11-306797 * 11/1999
JP 2003-059298 2/2003
KR 1998-082682 12/1998

OTHER PUBLICATIONS

English language abstract of Japanese Publication No. 05-180906.
English language abstract of Japanese Publication No. 11-306797.
English language abstract of Japanese Publication No. 2003-059298.

* cited by examiner 1000
1010
DPS
1100
RDQS INPUT BUFFER
BDPS
1020
DIN
1200
DATA INPUT BUFFER
BDIN
1400
SAMPLER
PDIN_F
PDIN_S
1600
ORDERING CIRCUIT
1030
WDQS
1300
WDQS INPUT BUFFER
PDQS
1500
DELAY CIRCUIT
DPDQS
1040
BODIN
<0:7>
HSC_EN
1700
DATA PATTERN SETTING CIRCUIT
FDIN
<0:7>

2000
2010
DPS<0:3>
2100
RDQS INPUT BUFFER
BDPS<0:3>
2020
DIN
2200
DATA INPUT BUFFER
BDIN
2400
SAMPLER
PDIN_F
PDIN_S
2040
2600
ORDERING CIRCUIT
BODIN <0:7>
2030
WDQS
2300
WDQS INPUT BUFFER
PDQS
2500
DELAY CIRCUIT
DPDQS
HSC_EN
2700
DATA PATTERN SETTING CIRCUIT
FDIN <0:7>

INPUT CIRCUIT OF SEMICONDUCTOR MEMORY DEVICE AND TEST SYSTEM HAVING THE SAME

CROSS-REFERENCE TO RELATED APPLICATIONS

This application is a continuation-in-part of U.S. patent application Ser. No. 11/336,331, filed on Jan. 20, 2006, now pending, which claims priority under 35 USC § 119 to Korean Patent Application No. 2005-06297, filed on Jan. 24, 2005 in the Korean Intellectual Property Office (KIPO), the disclosures of which are incorporated herein in their entirety by reference. This application also claims the benefit of priority under 35 U.S.C. § 119 to Korean Patent Application No. 2006-69300, filed on Jul. 24, 2006 in the KIPO, the disclosure of which is incorporated herein in its entirety by reference.

BACKGROUND OF THE INVENTION

1. Field of the Invention

Example embodiments of the present invention relate to a semiconductor memory device, and more particularly to a semiconductor memory device capable of generating data of various patterns in a test mode.

2. Description of the Related Art

Generally, a memory device is used for temporarily or permanently storing data and/or commands which are used in computers, communication systems, image processing systems, and the like. The memory device includes semiconductor memory devices, tapes, magnetic discs, optical discs, etc. Presently, the semiconductor memory device is the most widely used among the various memory devices.

According to a data storage method, these semiconductor memory devices may be categorized into dynamic random-access memory (DRAM), static random-access memory (SRAM), flash memory, and read-only memory (ROM). Storage capacities and operating speeds of these semiconductor memory devices are being rapidly increased.

In order to produce a semiconductor memory device, a semiconductor circuit design process, a manufacturing process, and a test process are sequentially performed. The test process determines an increase or decrease in product reliability. An external test device is configured to write a predetermined test pattern to a cell of the semiconductor memory device; the written test pattern is then read. By comparing the predetermined test pattern with the read test pattern, it may be determined whether or not the tested cell is defective.

The external test device provides an input test pattern and an external clock signal to the semiconductor memory device, and receives the read test pattern from the semiconductor memory device. The external test device compares the input test pattern and the read test pattern to determine whether or not the corresponding cell of the semiconductor memory device is defective.

Nowadays, a double data rate (DDR) mode is adapted in the semiconductor memory device. In the DDR mode, data transfers are performed two times in one clock cycle to increase data transfer rate without increasing a frequency of the external clock signal. In addition, a quadruple data rate (QDR) mode performing four data transfers in one clock cycle, and an octuple data rate (ODR) mode performing eight data transfers in one clock cycle are being researched.

Generally, test devices are developed more slowly than semiconductor memory devices. While the operation speed of semiconductor memory devices continues to rapidly increase to levels higher than 500 MHz, the operation speed of test devices continues to lag.

For example, when a clock frequency of a test device is only about 250 MHz, and a clock frequency of a semiconductor memory device is about 500 MHz, a common clock frequency for testing the semiconductor memory device is downwardly adjusted to the clock frequency of the test device. Moreover, a test device for a semiconductor memory device is very expensive. Thus, it is not easy to develop a new test device for performing a test of a new semiconductor memory device.

A conventional semiconductor memory device includes a frequency multiplier to double a frequency of an external clock signal in a test mode. For example, an exclusive-or (XOR) gate or a phase-locked loop (PLL) doubles the frequency of the external clock signal and generates an internal clock signal having an increased frequency to supplement a slow operation speed of a test device.

However, if a frequency of a clock signal is doubled, but a transfer speed (that is, a bit rate) of the test device is not increased, a testing speed of a semiconductor memory device may suffer. Accordingly, a need remains for a semiconductor memory device that can be tested at high speeds notwithstanding a low-speed tester.

SUMMARY OF THE INVENTION

Example embodiments of the present invention are provided to substantially obviate one or more problems due to limitations and disadvantages of the related art.

Some example embodiments of the present invention provide an input circuit of a semiconductor memory device, capable of generating data of various patterns in a test mode.

Some example embodiments of the present invention provide a semiconductor memory device including an input circuit capable of generating data of various patterns in a test mode, and performing a high-speed test by using a low-speed tester.

Some example embodiments of the present invention provide a test system capable of performing a high-speed test by using a low-speed tester.

Some example embodiments of the present invention provide a method of providing input data in a semiconductor memory device, capable of generating data of various patterns and performing a high-speed test by using a low-speed tester.

An example embodiment of the present invention includes a data input circuit configured to receive first data, and configured to generate second data by buffering the first data, sampling the buffered first data responsive to a write data strobe (WDQS) signal, and parallelizing the sampled data, and a pattern circuit configured to set a pattern of the second data responsive to a test mode signal and responsive to a data pattern select signal, and configured to generate third data.

Another example embodiment of the present invention includes a test system for a semiconductor memory device, including a semiconductor memory device configured to receive first data, to generate second data having a plurality of bits by sampling the first data responsive to a write data strobe (WDQS) signal, to parallelize the sampled data, to set a pattern of the second data responsive to a test mode signal and responsive to a data pattern select signal, to generate third data, and to apply the third data to a memory cell array of the semiconductor memory device, and a tester configured to provide the test mode signal, the WDQS signal, the data pattern select signal, and the first data to the semiconductor memory device.

Yet another example embodiment of the present invention includes a method for testing a semiconductor memory device, including receiving a plurality of signals, sampling at least one of the plurality of signals by generating a plurality of even data and a plurality of odd data, parallelizing the sampled signals by ordering the even data and the odd data, and generating a data pattern by inverting at least some of one of the odd or even data.

Accordingly, the semiconductor memory device including an input circuit according to example embodiments of the present invention may generate data of various patterns in a test mode, and may perform a high-speed test using a low-speed tester. The foregoing and other features, objects, and advantages of the various example embodiments of the invention will become more readily apparent from the following detailed description, which proceeds with reference to the accompanying drawings.

DESCRIPTION OF THE EMBODIMENTS

Figure 1:
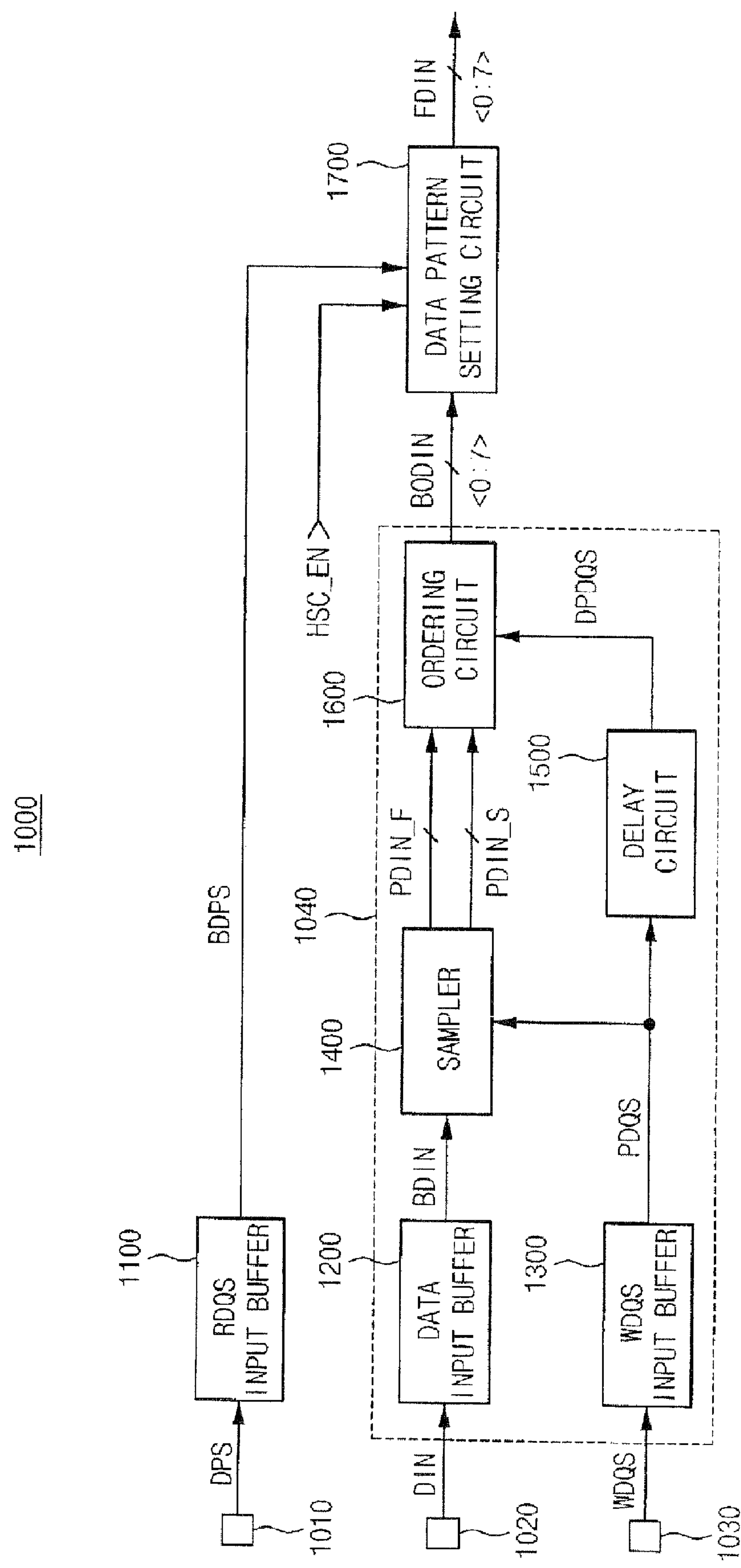
FIG. 1 shows a block diagram including an input circuit of a semiconductor memory device according to an example embodiment of the present invention.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 shows a block diagram including an input circuit of a semiconductor memory device according to an example embodiment of the present invention. Referring to FIG. 1, an input circuit 1000 of the semiconductor memory device includes an RDQS input buffer 1100, a data input circuit 1040, and a data pattern setting circuit 1700.

The RDQS input buffer 1100 receives a data pattern select signal DPS through an RDQS pin 1010, and buffers the data pattern select signal DPS. A data input circuit 1040 receives first data DIN through a DQ pin 1020, and a write DQS signal WDQS through a WDQS pin 1030. The data input circuit 1040 generates second data BODIN <0:7> by buffering the first data DIN, sampling buffered first data BDIN responsive to the write DQS signal WDQS, and parallelizing sampled data. The data pattern setting circuit 1700 sets a pattern of the second data BODIN <0:7> to generate third data FDIN <0:7> responsive to a test mode signal HSC_EN and a buffered data pattern select signal BDPS.

In a normal mode, logic states of the second data BODIN <0:7> are not inverted. However, in a test mode, logic states of even data of the second data BODIN <0:7> are not inverted, but logic states of odd data of the second data BODIN <0:7> are set responsive to the buffered data pattern select signal BDPS.

The data input circuit 1040 includes a data input buffer 1200, a WDQS input buffer 1300, a sampler 1400, a delay circuit 1500, and an ordering circuit 1600. The data input buffer 1200 buffers the first data DIN to generate the buffered first data BDIN. The WDQS input buffer 1300 buffers the write DQS signal WDQS to generate a first write DQS signal PDQS. The sampler 1400 samples the buffered first data BDIN responsive to the first write DQS signal PDQS to generate even data PDIN_F and odd data PDIN_S. The delay circuit 1500 delays the first write DQS signal PDQS to generate a second write DQS signal DPDQS. The ordering circuit 1600 parallelizes the even data PDIN_F and the odd data PDIN_S responsive to the second write DQS signal DPDQS, to determine an order of parallelized data, to then generate the second data BODIN <0:7>.

Figure 2:
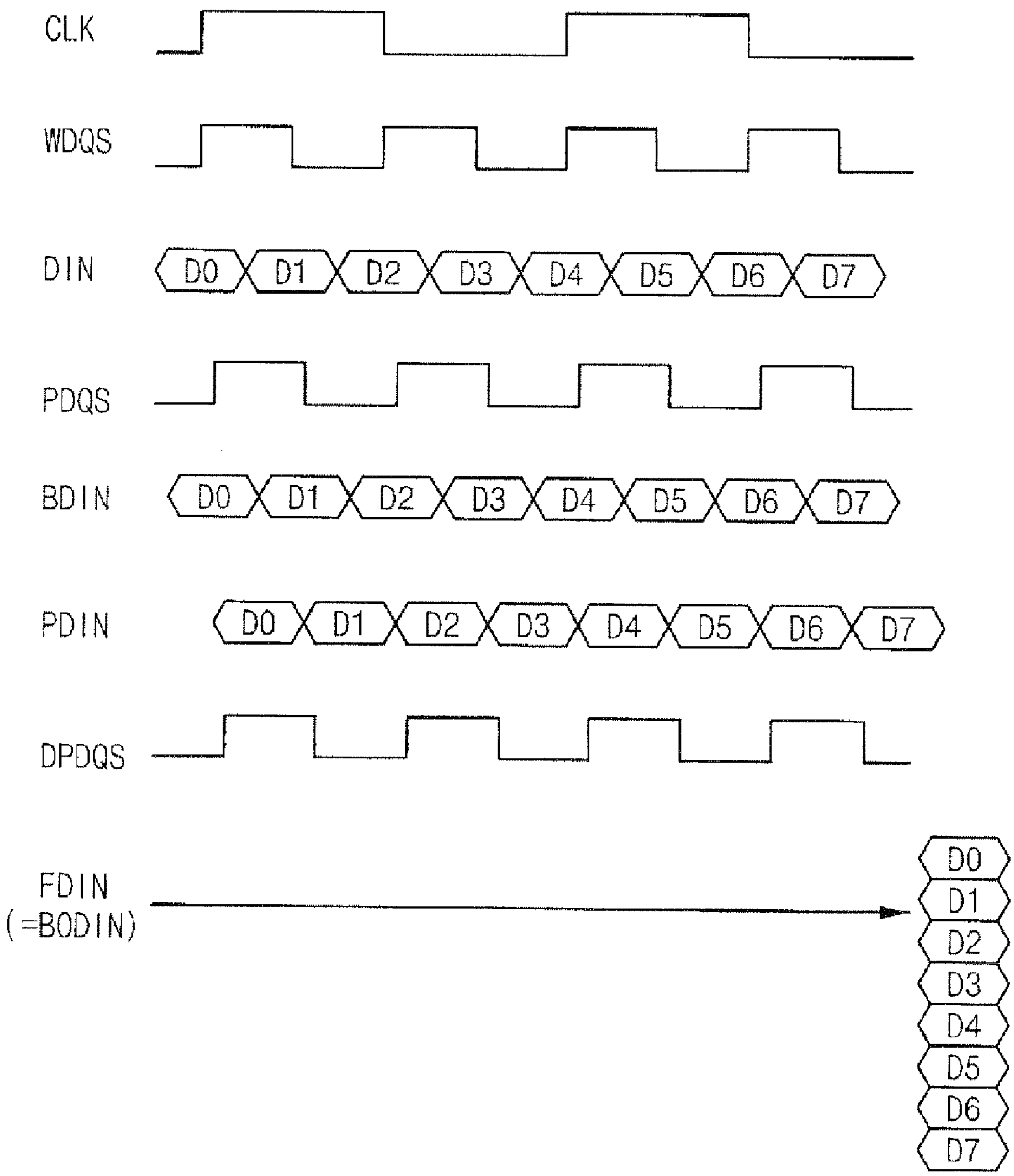
FIG. 2 shows a timing diagram including an operation of the input circuit of the semiconductor memory device in FIG. 1 in a normal mode.

FIG. 2 shows a timing diagram including an operation of the input circuit of the semiconductor memory device in FIG. 1 in a normal mode.

Figure 3:
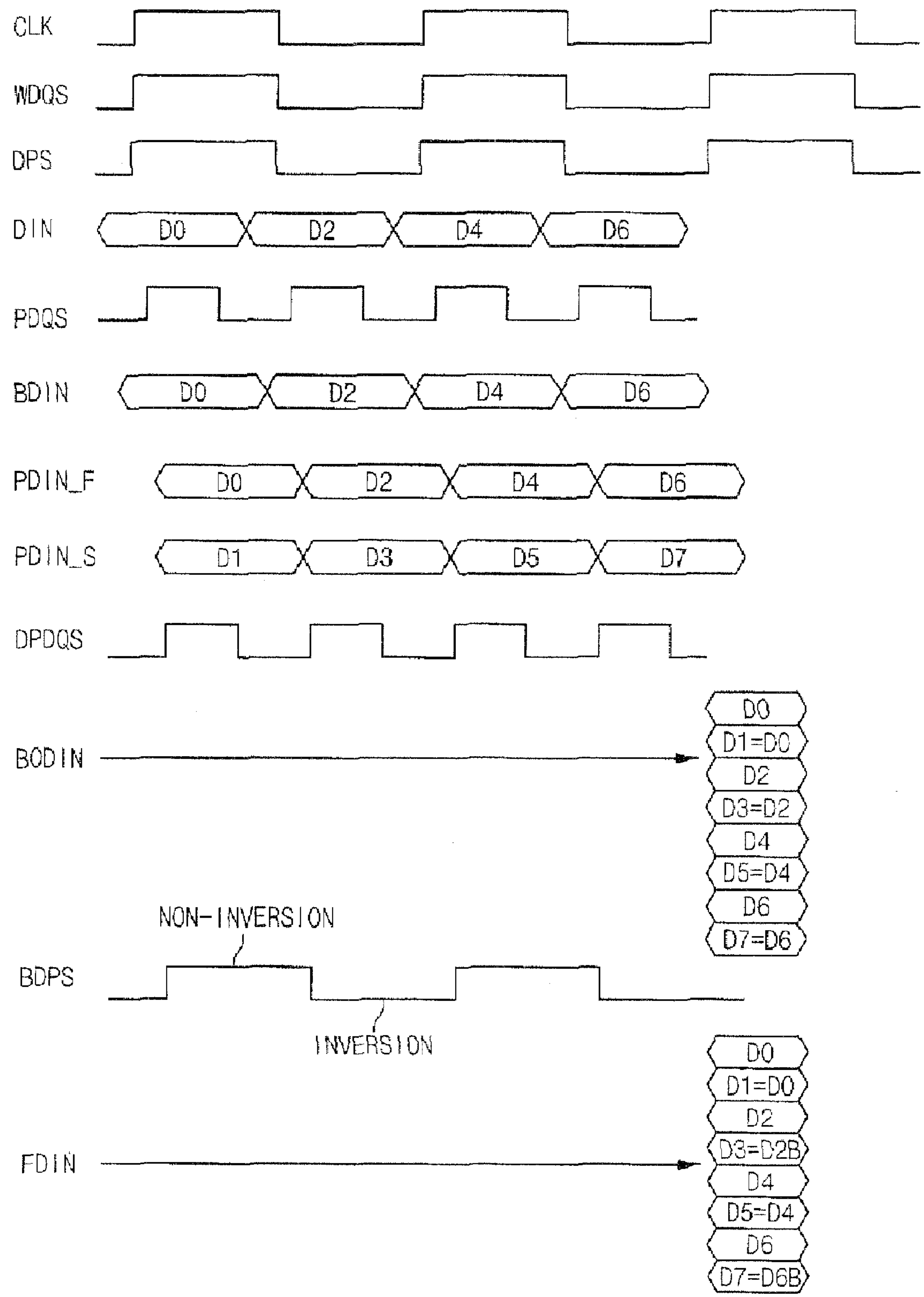
FIG. 3 shows a timing diagram including an operation of the input circuit of the semiconductor memory device in FIG. 1 in a test mode.

FIG. 3 shows a timing diagram including an operation of the input circuit of the semiconductor memory device in FIG. 1 in a test mode.

Figure 4:
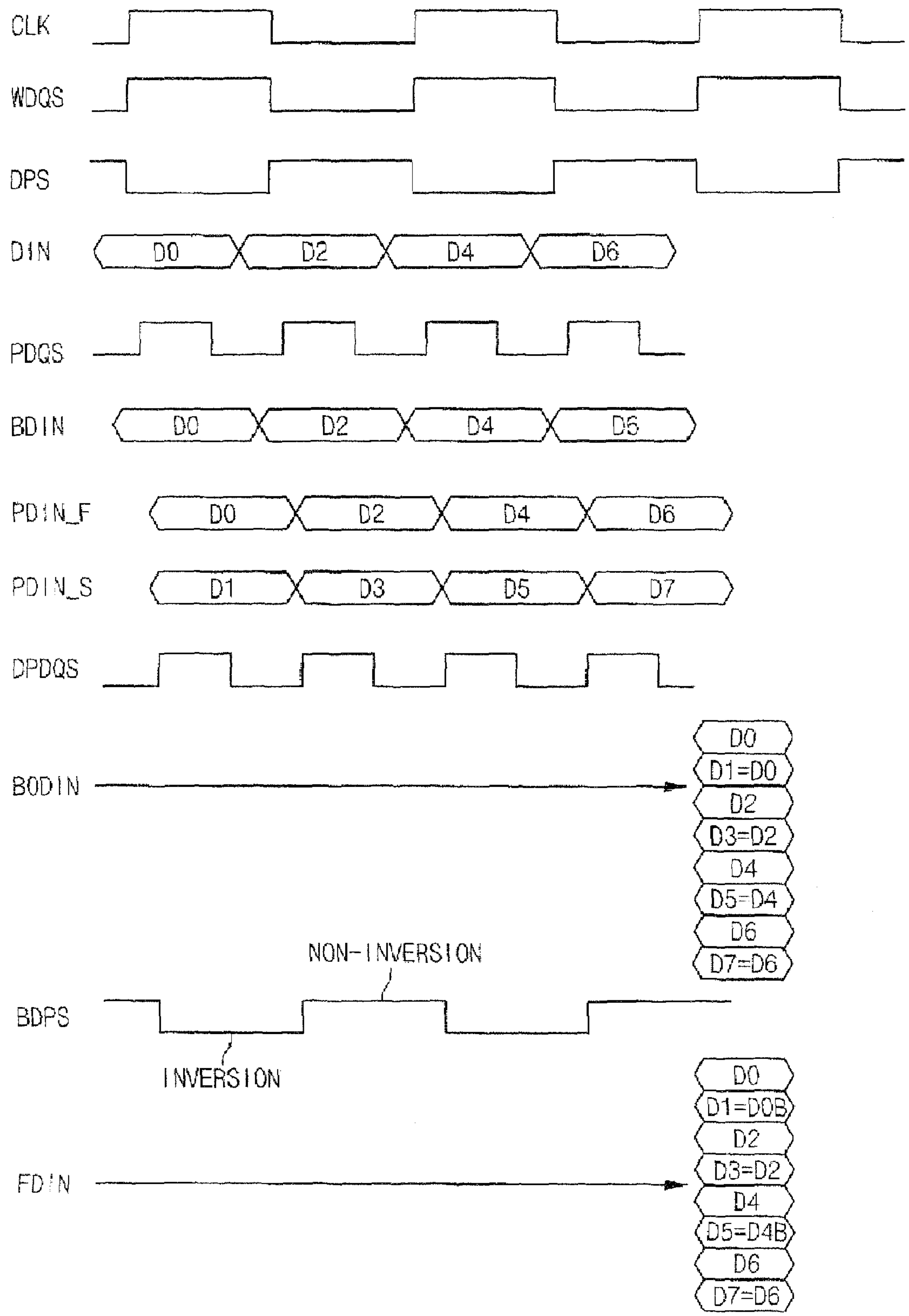
FIG. 4 shows a timing diagram including another operation of the input circuit of the semiconductor memory device in FIG. 1 in a test mode.

FIG. 4 shows a timing diagram including another operation of the input circuit of the semiconductor memory device in FIG. 1 in a test mode.

Hereinafter, operations of the input circuit of the semiconductor memory device in FIG. 1 will be described with reference to FIGS. 1 through 4. Referring to FIGS. 1 and 2, the write DQS signal WDQS may be generated in synchronization with a clock signal CLK. In FIG. 2, a frequency of the write DQS signal WDQS may be twice that of the clock signal CLK. The buffered first data BDIN may be output from the data input buffer 1200 by buffering the first data DIN input from the exterior. The first write DQS signal PDQS may be output from the WDQS input buffer 1300 by buffering the write DQS signal WDQS. The sampler 1400 samples the buffered first data BDIN responsive to the first write DQS signal PDQS, to generate the even data PDIN_F and the odd data PDIN_S. However, in a normal mode, the sampler 1400 generates output data PDIN having 8-bit data D0 through D7 without a distinction between the even data PDIN_F and the odd data PDIN_S as illustrated in FIG. 2. The ordering circuit 1600 parallelizes the output data PDIN of the sampler 1400 responsive to the second write DQS signal DPDQS delayed from the first write DQS signal PDQS, to determine an order of parallelized data, to then generate the second data BODIN <0:7>. The data pattern setting circuit 1700 generates the third data FDIN <0:7> without any changes in a pattern of the second data BODIN <0:7> in a normal mode.

Referring to FIGS. 1 and 3, the write DQS signal WDQS may be generated in synchronization with a clock signal CLK. In FIG. 3, each frequency of the write DQS signal WDQS and the data pattern select signal DPS may be identical with a frequency of the clock signal CLK. The first data DIN input from the exterior may have 4-bit data D0, D2, D4, and D6. The buffered first data BDIN may be output from the data input buffer 1200 by buffering the first data DIN. The first write DQS signal PDQS may be output from the WDQS input buffer 1300 by buffering the write DQS signal WDQS. The sampler 1400 samples the buffered first data BDIN responsive to the first write DQS signal PDQS to generate the even data PDIN_F and the odd data PDIN_S. In a test mode, the even data PDIN_F are D0, D2, D4, and D6, and the odd data PDIN_S are D1, D3, D5, and D7 as illustrated in FIG. 2. The ordering circuit 1600 parallelizes the even data PDIN_F and the odd data PDIN_S responsive to the second write DQS signal DPDQS delayed from the first write DQS signal PDQS, to determine an order of parallelized data, and to then generate the second data BODIN <0:7>.

In a test mode, each even data D0, D2, D4, and D6 of the second data BODIN <0:7> may have a logic state identical with that of each bit of the first data DIN, and each odd data D1, D3, D5, and D7 of the second data BODIN <0:7> may have a logic state identical with that of each bit of the first data DIN. As illustrated in FIG. 3, the buffered data pattern select signal BDPS is a pulse signal having a logic "high" or a logic "low." In the buffered data pattern select signal BDPS, a logic "high" may indicate a non-inversion, and a logic "low" may indicate an inversion. The data pattern setting circuit 1700 sets a pattern of the second data BODIN <0:7> responsive to the test mode signal HSC_EN and the buffered data pattern select signal BDPS, to generate the third data FDIN <0:7>.

In a test mode, each even data D0, D2, D4, and D6 of the third data FDIN <0:7> may have a logic state identical with that of each bit of the first data DIN. However, each odd data D1, D3, D5, and D7 of the third data FDIN <0:7> may have a logic state inverted or non-inverted from each even data D0, D2, D4, and D6 of the third data FDIN <0:7> responsive to the buffered data pattern select signal BDPS. In FIG. 3, a logic state of the odd data D1 of the third data FDIN <0:7> may be identical with that of the even data D0 of the third data FDIN <0:7>, a logic state of the odd data D3 of the third data FDIN <0:7> may be inverted from that of the even data D2 of the third data FDIN <0:7>, a logic state of the odd data D5 of the third data FDIN <0:7> may be identical with that of the even data D4 of the third data FDIN <0:7>, and a logic state of the odd data D7 of the third data FDIN <0:7> may be inverted from that of the even data D6 of the third data FDIN <0:7>.

A phase of the data pattern select signal DPS in FIG. 4 may be opposite to a phase of the data pattern select signal DPS in FIG. 3.

Referring to FIGS. 1 and 4, the buffered data pattern select signal BDPS is a pulse signal having a logic "high" or a logic "low." For example, a logic "high" may indicate a non-inversion state, and a logic "low" may indicate an inversion state. The data pattern setting circuit 1700 sets a pattern of the second data BODIN <0:7> responsive to the test mode signal HSC_EN and the buffered data pattern select signal BDPS, to generate the third data FDIN <0:7>.

In a test mode, each even data D0, D2, D4, and D6 of the third data FDIN <0:7> may have a logic state identical with that of each bit of the first data DIN. However, each odd data D1, D3, D5, and D7 of the third data FDIN <0:7> may have a logic state inverted or non-inverted with respect to each even data D0, D2, D4, and D6 of the third data FDIN <0:7> responsive to the buffered data pattern select signal BDPS. In FIG. 4, a logic state of the odd data D1 of the third data FDIN <0:7> may be inverted from that of the even data D0 of the third data FDIN <0:7>, a logic state of the odd data D3 of the third data FDIN <0:7> may be identical with that of the even data D2 of the third data FDIN <0:7>, a logic state of the odd data D5 of the third data FDIN <0:7> may be inverted from that of the even data D4 of the third data FDIN <0:7>, and a logic state of the odd data D7 of the third data FDIN <0:7> may be identical with that of the even data D6 of the third data FDIN <0:7>.

As described above, the input circuit 1000 of the semiconductor memory device in FIG. 1 may generate various patterns of an input signal according to a logic state of the data pattern select signal DPS. The data pattern select signal DPS may be received through the RDQS pin 1010.

Figure 5:
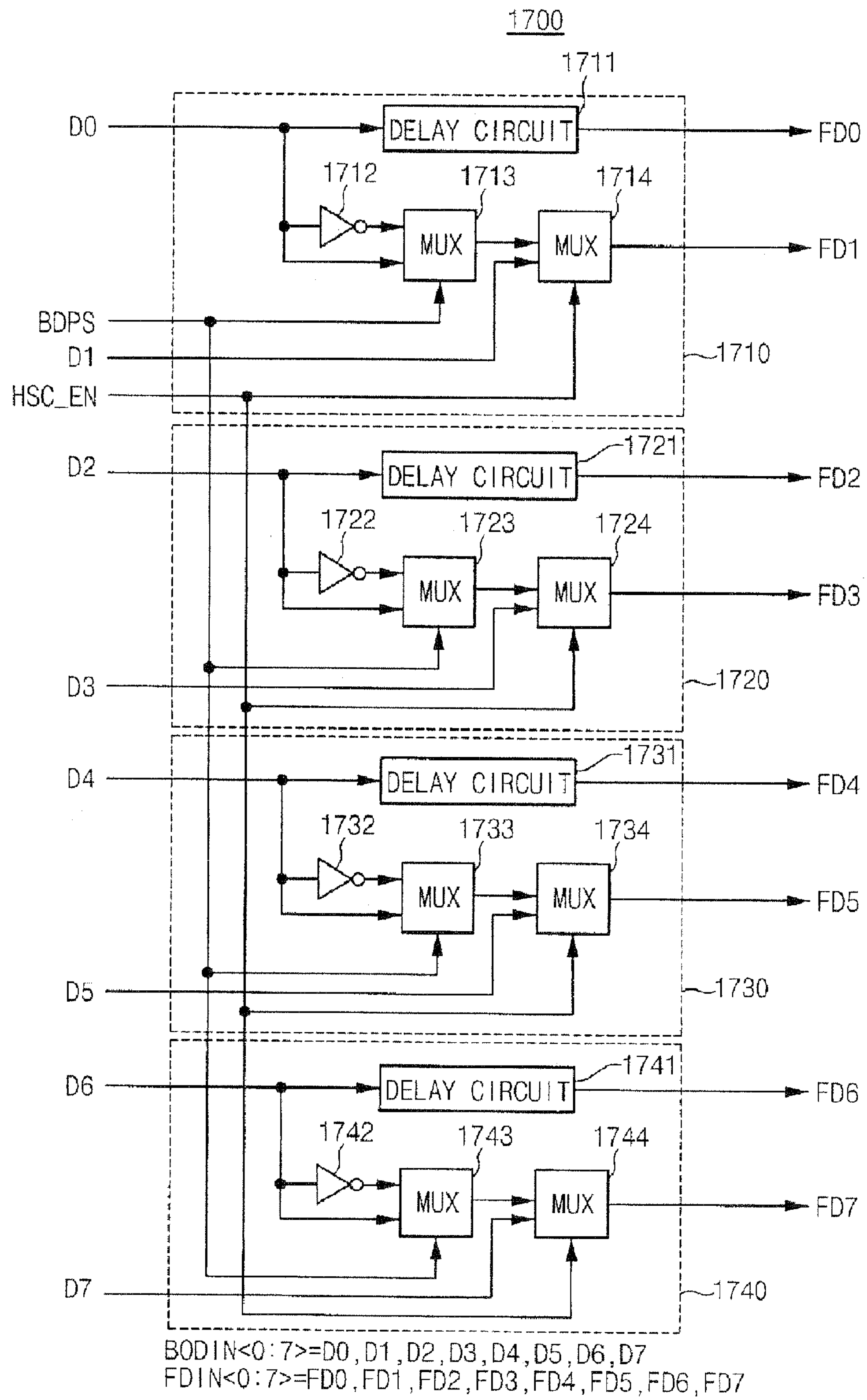
FIG. 5 shows a circuit diagram including the data pattern setting circuit of the input circuit of the semiconductor memory device in FIG. 1.

FIG. 5 shows a circuit diagram including the data pattern setting circuit of the input circuit of the semiconductor memory device in FIG. 1. Referring to FIG. 5, the data pattern setting circuit 1700 includes a first data pattern setting circuit 1710, a second data pattern setting circuit 1720, a third data pattern setting circuit 1730, and a fourth data pattern setting circuit 1740.

The first data pattern setting circuit 1710 generates a first bit FD0 and a second bit FD1 of the third data FDIN <0:7> from a first bit D0 and a second bit D1 of the second data BODIN <0:7> responsive to the test mode signal HSC_EN and the buffered data pattern select signal BDPS. The second data pattern setting circuit 1720 generates a third bit FD2 and a fourth bit FD3 of the third data FDIN <0:7> from a third bit D2 and a fourth bit D3 of the second data BODIN <0:7> responsive to the test mode signal HSC_EN and the buffered data pattern select signal BDPS. The third data pattern setting circuit 1730 generates a fifth bit FD4 and a sixth bit FD5 of the third data FDIN <0:7> from a fifth bit D4 and a sixth bit D5 of the second data BODIN <0:7> responsive to the test mode signal HSC_EN and the buffered data pattern select signal BDPS. The fourth data pattern setting circuit 1740 generates a seventh bit FD6 and an eighth bit FD7 of the third data FDIN <0:7> from a seventh bit D6 and an eighth bit D7 of the second data BODIN <0:7> responsive to the test mode signal HSC_EN and the buffered data pattern select signal BDPS.

The first data pattern setting circuit 1710 includes a first delay circuit 1711, a first inverter 1712, a first multiplexer 1713, and a second multiplexer 1714. The first delay circuit 1711 delays the first bit D0 of the second data BODIN <0:7> to generate the first bit FD0 of the third data FDIN <0:7>. The first inverter 1712 inverts a logic state of the first bit D0 of the second data BODIN <0:7>. The first multiplexer 1713 selects one of an output signal of the inverter 1712 and the first bit D0 of the second data BODIN <0:7> responsive to the buffered data pattern select signal BDPS. The second multiplexer 1714 selects one of the second bit D1 of the second data BODIN <0:7> and an output signal of the first multiplexer 1713 responsive to the test mode signal HSC_EN to generate the second bit FD1 of the third data FDIN <0:7>.

The second data pattern setting circuit 1720 includes a second delay circuit 1721, a second inverter 1722, a third multiplexer 1723, and a fourth multiplexer 1724. The second delay circuit 1721 delays the third bit D2 of the second data BODIN <0:7> to generate the third bit FD2 of the third data FDIN <0:7>. The second inverter 1722 inverts a logic state of the third bit D2 of the second data BODIN <0:7>. The third multiplexer 1723 selects one of an output signal of the second inverter 1722 and the third bit D2 of the second data BODIN <0:7> responsive to the buffered data pattern select signal BDPS. The fourth multiplexer 1724 selects one of the fourth bit D3 of the second data BODIN <0:7> and an output signal of the third multiplexer 1723 responsive to the test mode signal HSC_EN to generate the fourth bit FD3 of the third data FDIN <0:7>.

The third data pattern setting circuit 1730 includes a third delay circuit 1731, a third inverter 1732, a fifth multiplexer 1733, and a sixth multiplexer 1734. The third delay circuit 1731 delays the fifth bit D4 of the second data BODIN <0:7> to generate the fifth bit FD4 of the third data FDIN <0:7>. The third inverter 1732 inverts a logic state of the fifth bit D4 of the second data BODIN <0:7>. The fifth multiplexer 1733 selects one of an output signal of the third inverter 1732 and the fifth bit D4 of the second data BODIN <0:7> responsive to the buffered data pattern select signal BDPS. The sixth multiplexer 1734 selects one of the sixth bit D5 of the second data BODIN <0:7> and an output signal of the fifth multiplexer 1733 responsive to the test mode signal HSC_EN to generate the sixth bit FD5 of the third data FDIN <0:7>.

The fourth data pattern setting circuit 1740 includes a fourth delay circuit 1741, a fourth inverter 1742, a seventh multiplexer 1743, and an eighth multiplexer 1744. The fourth delay circuit 1741 delays the seventh bit D6 of the second data BODIN <0:7> to generate the seventh bit FD6 of the third data FDIN <0:7>. The fourth inverter 1742 inverts a logic state of the seventh bit D6 of the second data BODIN <0:7>. The seventh multiplexer 1743 selects one of an output signal of the fourth inverter 1742 and the seventh bit D6 of the second data BODIN <0:7> responsive to the buffered data pattern select signal BDPS. The eighth multiplexer 1744 selects one of the eighth bit D7 of the second data BODIN <0:7> and an output signal of the seventh multiplexer 1743 responsive to the test mode signal HSC_EN to generate the eighth bit FD7 of the third data FDIN <0:7>. The data pattern setting circuit 1700 in FIG. 5 generates each bit of the third data FDIN <0:7> responsive to one pulse-shaped buffered data pattern select signal BDPS.

Figure 6:
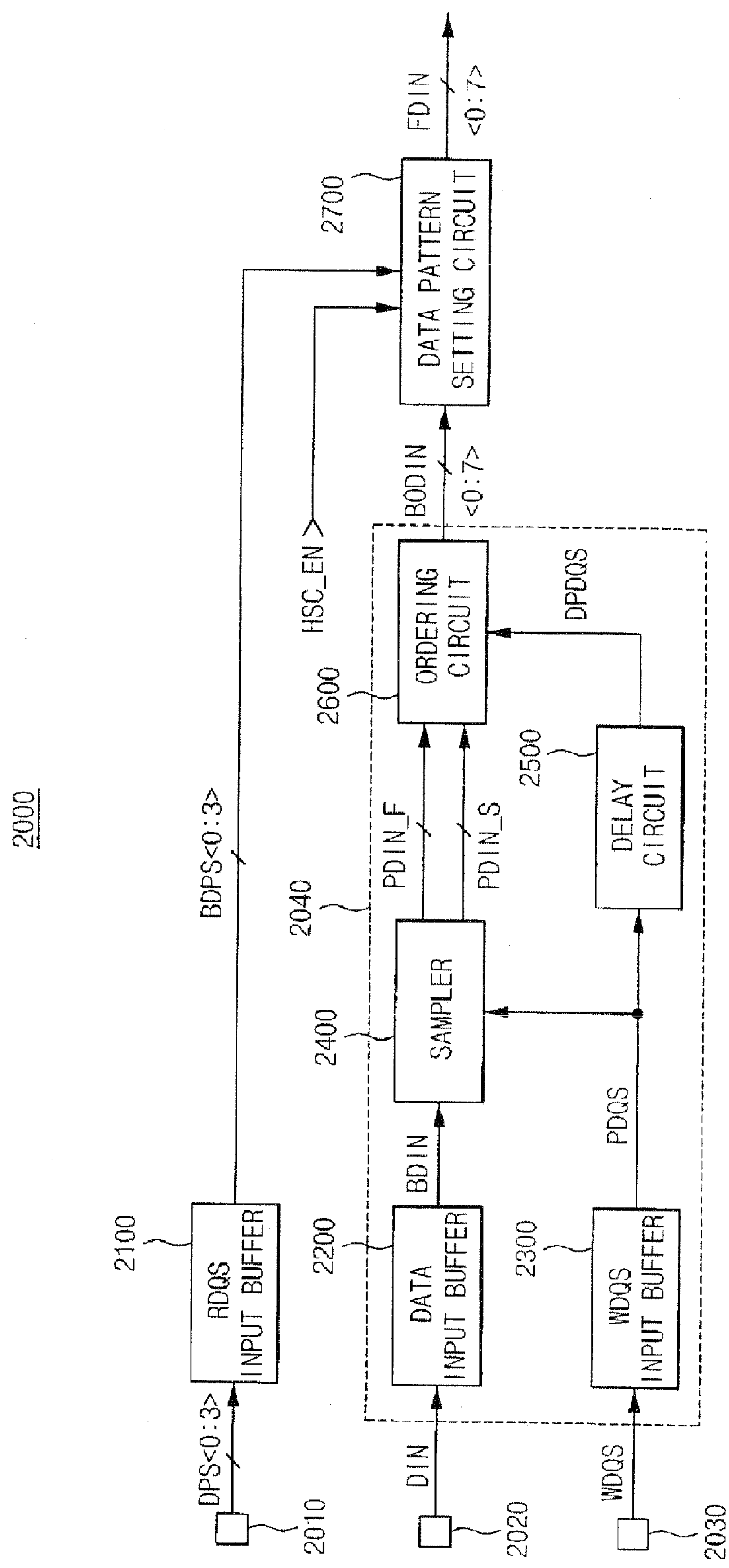
FIG. 6 shows a block diagram including an input circuit of a semiconductor memory device according to another example embodiment of the present invention.

FIG. 6 shows a block diagram including an input circuit of a semiconductor memory device according to another example embodiment of the present invention. In the input circuit 2000 of the semiconductor memory device in FIG. 6, a data pattern select signal DPS <0:3> may be a 4-bit signal received through an RDQS pin 2010, differently from the data pattern select signal DPS of the input circuit 1000 in FIG. 1.

Referring to FIG. 6, the input circuit 2000 of the semiconductor memory device includes an RDQS input buffer 2100, a data input circuit 2040, and a data pattern setting circuit 2700. The RDQS input buffer 2100 receives the data pattern select signal DPS <0:3> through the RDQS pin 2010 to buffer the data pattern select signal DPS <0:3>. The data input circuit 2040 receives first data DIN through a DQ pin 2020, and a write DQS signal through a WDQS pin 2030. The data input circuit 2040 generates second data BODIN <0:7> by buffering the first data DIN, sampling buffered first data BDIN responsive to the write DQS signal WDQS, and parallelizing sampled data. The data pattern setting circuit 2700 sets a pattern of the second data BODIN <0:7> responsive to a test mode signal HSC_EN and a buffered data pattern select signal BDPS <0:3>, to generate third data FDIN <0:7>.

In a normal mode, logic states of the second data BODIN <0:7> are not inverted. However, in a test mode, logic states of even data of the second data BODIN <0:7> are not inverted, but logic states of odd data of the second data BODIN <0:7> are set responsive to the buffered data pattern select signal BDPS <0:3>.

The data input circuit 2040 includes a data input buffer 2200, a WDQS input buffer 2300, a sampler 2400, a delay circuit 2500, and an ordering circuit 2600. The data input buffer 2200 buffers the first data DIN to generate the buffered first data BDIN. The WDQS input buffer 2300 buffers the write DQS signal WDQS to generate a first write DQS signal PDQS. The sampler 2400 samples the buffered first data BDIN responsive to the first write DQS signal PDQS, to generate even data PDTN_F and odd data PDIN_S. The delay circuit 2500 delays the first write DQS signal PDQS to generate a second write DQS signal DPDQS. The ordering circuit 2600 parallelizes the even data PDIN_F and the odd data PDIN_S responsive to the second write DQS signal DPDQS, to determine an order of parallelized data, to then generate the second data BODIN <0:7>.

Figure 7:
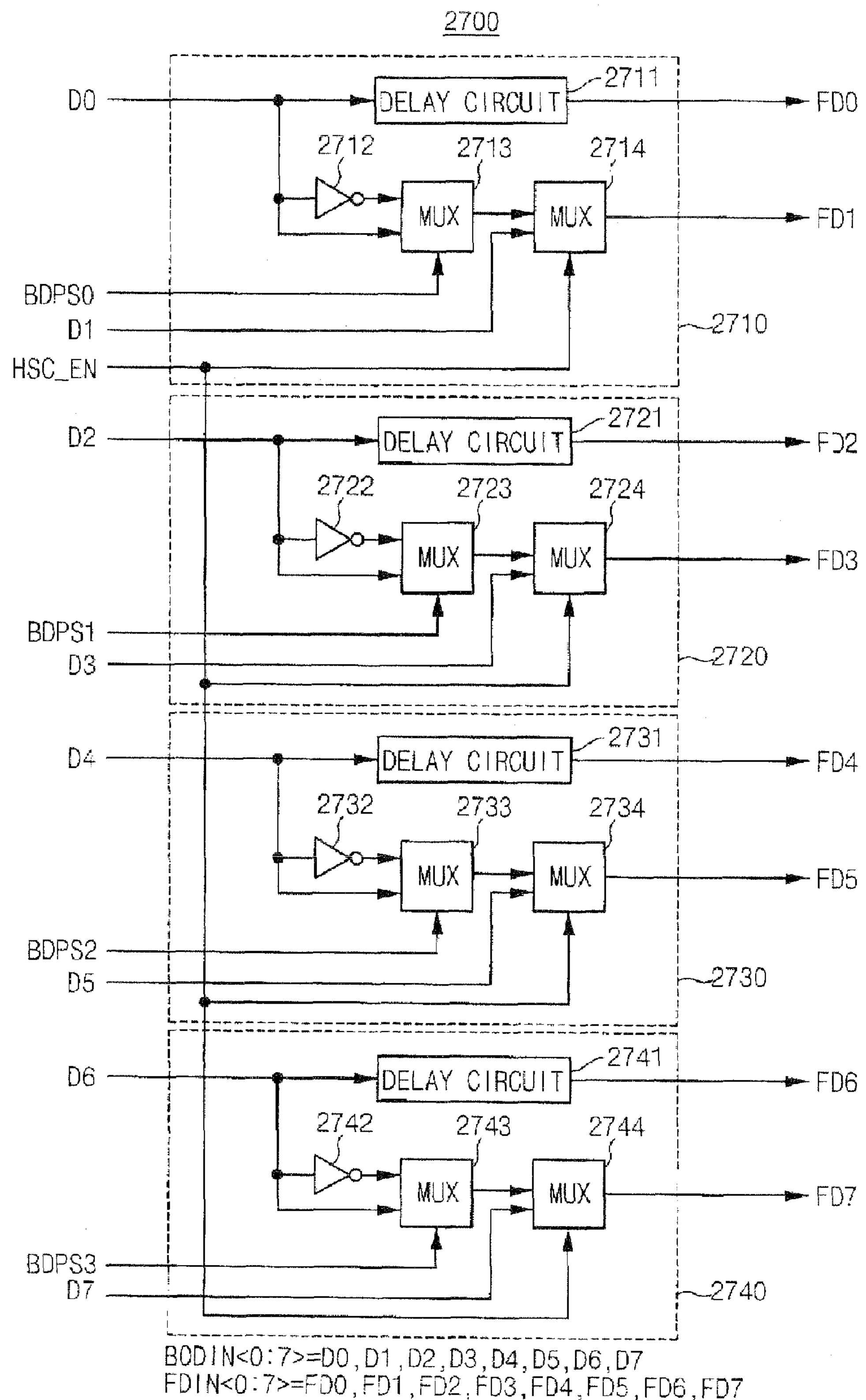
FIG. 7 shows a circuit diagram including the data pattern setting circuit of the input circuit of the semiconductor memory device in FIG. 6.

FIG. 7 shows a circuit diagram including the data pattern setting circuit of the input circuit of the semiconductor memory device in FIG. 6. Referring to FIG. 7, the data pattern setting circuit 2700 includes a first data pattern setting circuit 2710, a second data pattern setting circuit 2720, a third data pattern setting circuit 2730, and a fourth data pattern setting circuit 2740. The buffered data pattern select signal BDPS <0:3> may be a 4-bit signal. Thus, the buffered data pattern select signal BDPS <0:3> may include a first buffered data pattern select signal BDPS0, a second buffered data pattern select signal BDPS1, a third buffered data pattern select signal BDPS2 and a fourth buffered data pattern select signal BDPS3. The first through fourth buffered data pattern select signals BDPS0, BDPS1, BDPS2, and BDPS3 may be applied to the data pattern setting circuits 2710, 2720, 2730 and 2740, respectively.

The first data pattern setting circuit 2710 generates a first bit FD0 and a second bit FD1 of the third data FDIN <0:7> from a first bit D0 and a second bit D1 of the second data BODIN <0:7> responsive to the test mode signal HSC_EN and the first buffered data pattern select signal BDPS0. The second data pattern setting circuit 2720 generates a third bit FD2 and a fourth bit FD3 of the third data FDIN <0:7> from a third bit D2 and a fourth bit D3 of the second data BODIN <0:7> responsive to the test mode signal HSC_EN and the second buffered data pattern select signal BDPS1. The third data pattern setting circuit 2730 generates a fifth bit FD4 and a sixth bit FD5 of the third data FDIN <0:7> from a fifth bit D4 and a sixth bit D5 of the second data BODIN <0:7> responsive to the test mode signal HSC_EN and the third buffered data pattern select signal BDPS2. The fourth data pattern setting circuit 2740 generates a seventh bit FD6 and an eighth bit FD7 of the third data FDIN <0:7> from a seventh bit D6 and an eighth bit D7 of the second data BODIN <0:7> responsive to the test mode signal HSC_EN and the fourth buffered data pattern select signal BDPS3.

The first data pattern setting circuit 2710 includes a first delay circuit 2711, a first inverter 2712, a first multiplexer 2713, and a second multiplexer 2714. The first delay circuit 2711 delays the first bit D0 of the second data BODIN <0:7> to generate the first bit FD0 of the third data FDIN <0:7>. The first inverter 2712 inverts a logic state of the first bit D0 of the second data BODIN <0:7>. The first multiplexer 2713 selects one of an output signal of the first inverter 2712 and the first bit D0 of the second data BODIN <0:7> responsive to the first buffered data pattern select signal BDPS0. The second multiplexer 2714 selects one of the second bit D1 of the second data BODIN <0:7> and an output signal of the first multiplexer 2713 responsive to the test mode signal HSC_EN, to generate the second bit FD1 of the third data FDIN <0:7>.

The second data pattern setting circuit 2720 includes a second delay circuit 2721, a second inverter 2722, a third multiplexer 2723, and a fourth multiplexer 2724. The second delay circuit 2721 delays the third bit D2 of the second data BODIN <0:7> to generate the third bit FD2 of the third data FDIN <0:7>. The second inverter 2722 inverts a logic state of the third bit D2 of the second data BODIN <0:7>. The third multiplexer 2723 selects one of an output signal of the second inverter 2722 and the third bit D2 of the second data BODIN <0:7> responsive to the second buffered data pattern select signal BDPS1. The fourth multiplexer 2724 selects one of the fourth bit D3 of the second data BODIN <0:7> and an output signal of the third multiplexer 2723 responsive to the test mode signal HSC_EN, to generate the fourth bit FD3 of the third data FDIN <0:7>.

The third data pattern setting circuit 2730 includes a third delay circuit 2731, a third inverter 2732, a fifth multiplexer 2733, and a sixth multiplexer 2734. The third delay circuit 2731 delays the fifth bit D4 of the second data BODIN <0:7> to generate the fifth bit FD4 of the third data FDIN <0:7>. The third inverter 2732 inverts a logic state of the fifth bit D4 of the second data BODIN <0:7>. The fifth multiplexer 2733 selects one of an output signal of the third inverter 2732 and the fifth bit D4 of the second data BODIN <0:7> responsive to the third buffered data pattern select signal BDPS2. The sixth multiplexer 2734 selects one of the sixth bit D5 of the second data BODIN <0:7> and an output signal of the fifth multiplexer 2733 responsive to the test mode signal HSC_EN, to generate the sixth bit FD5 of the third data FDIN <0:7>.

The fourth data pattern setting circuit 2740 includes a fourth delay circuit 2741, a fourth inverter 2742, a seventh multiplexer 2743, and an eighth multiplexer 2744. The fourth delay circuit 2741 delays the seventh bit D6 of the second data BODIN <0:7> to generate the seventh bit FD6 of the third data FDIN <0:7>. The fourth inverter 2742 inverts a logic state of the seventh bit D6 of the second data BODIN <0:7>. The seventh multiplexer 2743 selects one of an output signal of the fourth inverter 2742 and the seventh bit D6 of the second data BODIN <0:7> responsive to the fourth buffered data pattern select signal BDPS3. The eighth multiplexer 2744 selects one of the eighth bit D7 of the second data BODIN <0:7> and an output signal of the seventh multiplexer 2743 responsive to the test mode signal HSC_EN, to generate the eighth bit FD7 of the third data FDIN <0:7>. The data pattern setting circuit 2700 in FIG. 7 generates bits of the third data FDIN <0:7> responsive to a plurality of buffered data pattern select signals BDPS <0:3>.

Figure 8:
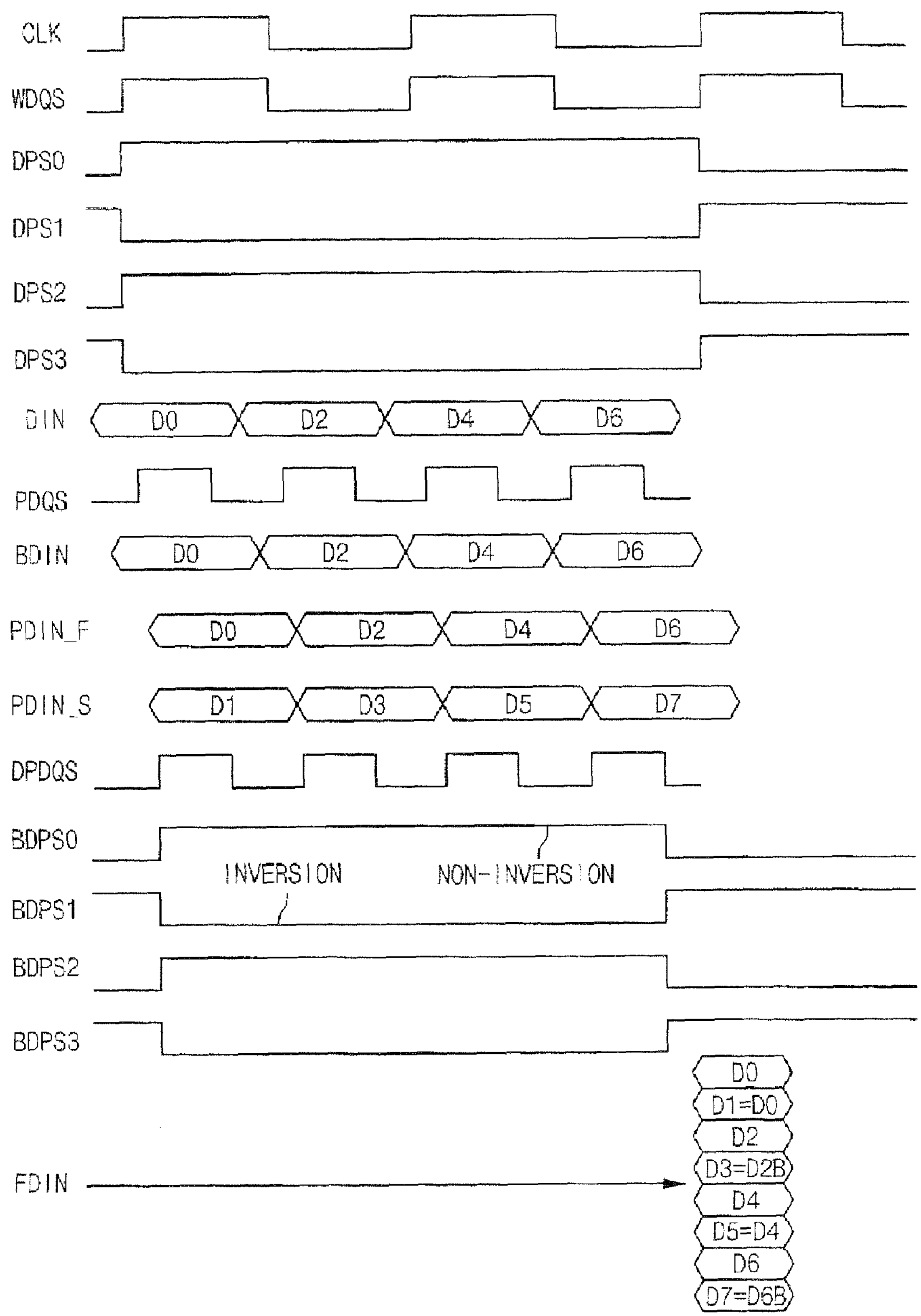
FIG. 8 shows a timing diagram including an operation of the input circuit of the semiconductor memory device in FIG. 6 in a test mode.

FIG. 8 shows a timing diagram including an operation of the input circuit of the semiconductor memory device in FIG. 6 in a test mode.

Figure 9:
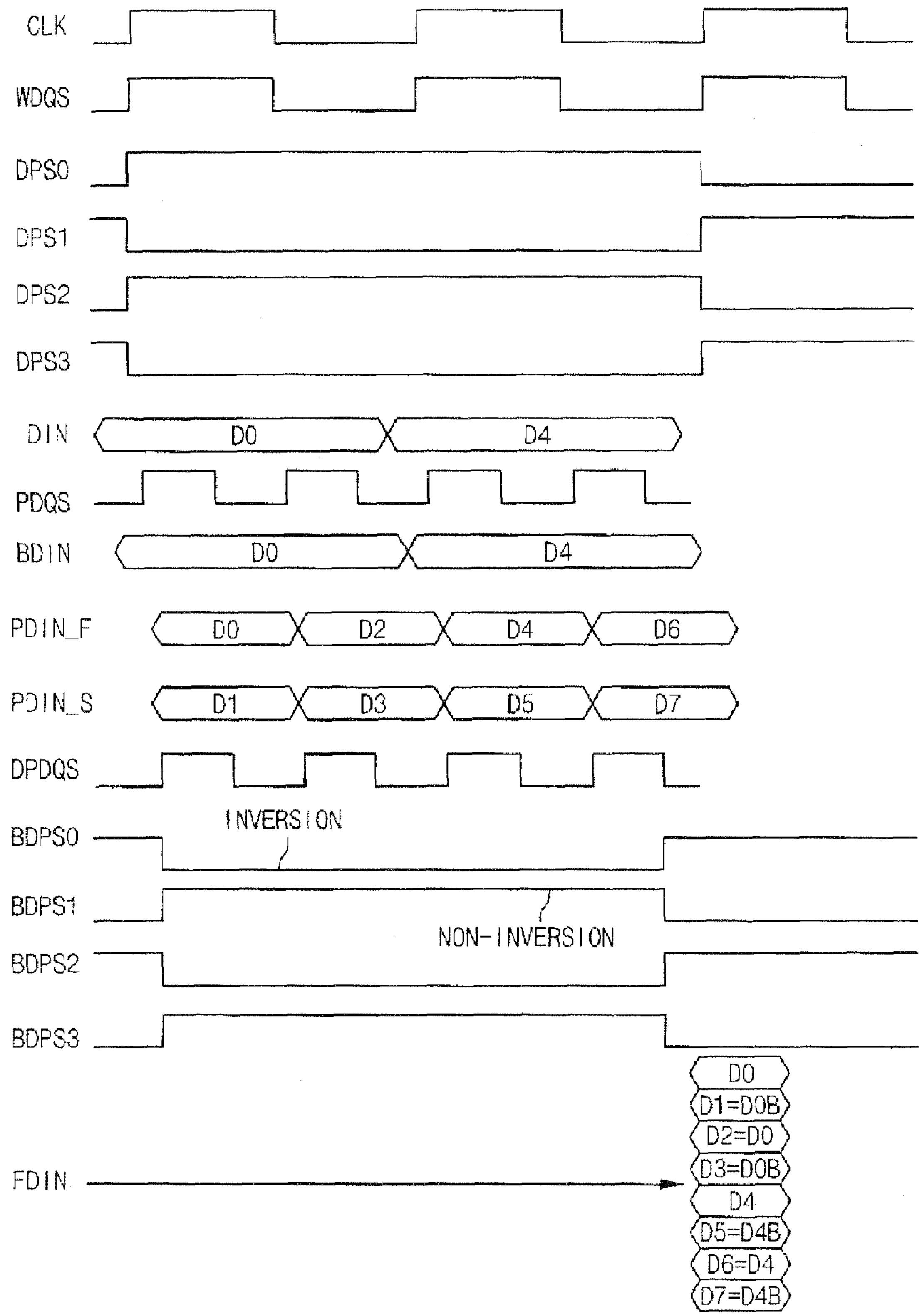
FIG. 9 shows a timing diagram including an operation of the input circuit of the semiconductor memory device in FIG. 6 in a test mode.

FIG. 9 shows a timing diagram including an operation of the input circuit of the semiconductor memory device in FIG. 6 in a test mode.

Hereinafter, operations of the input circuit of the semiconductor memory device according to second example embodiment of the present invention will be described with reference to FIGS. 6 through 9. In the input circuit 2000 of the semiconductor memory device in FIG. 6, the data pattern select signal DPS <0:3> may be a 4-bit signal, differently from the input circuit 1000 of the semiconductor memory device in FIG. 1. The data pattern setting circuit 2700 sets a pattern of the second data BODIN <0:7> responsive to the test mode signal HSC_EN and the buffered data pattern select signal BDPS <0:3>, to generate the third data FDIN <0:7>.

In FIG. 8, the data pattern select signal DPS <0:3> includes a first data pattern select signal DPS0, a second data pattern select signal DPS 1, a third data pattern select signal DPS2, and a fourth data pattern select signal DPS3, and the buffered data pattern select signal BDPS <0:3> includes a first buffered data pattern select signal BDPS0, a second buffered data pattern select signal BDPS1, a third buffered data pattern select signal BDPS2, and a fourth buffered data pattern select signal BDPS3.

Referring to FIG. 8, the first buffered data pattern select signal BDPS0 is a logic "high," the second buffered data pattern select signal BDPS1 is a logic "low," the third buffered data pattern select signal BDPS2 is a logic "high," and the fourth buffered data pattern select signal BDPS3 is a logic "low."

In a test mode, each even data D0, D2, D4 and D6 of the third data FDIN <0:7> may have an identical logic state with each bit of the first data DIN. However, each odd data D1, D3, D5 and D7 of the third data FDIN <0:7> may have an inverted or non-inverted logic state with respect to each even data D0, D2, D4 and D6 of the third data FDIN <0:7> responsive to the first through fourth buffered data pattern select signals BDPS0, BDPS1, BDPS2, and BDPS3. In FIG. 8, a logic state of the odd data D1 of the third data FDIN <0:7> may be identical with that of the even data D0 of the third data FDIN <0:7>. A logic state of the odd data D3 of the third data FDIN <0:7> may be inverted from that of the even data D2 of the third data FDIN <0:7>. A logic state of the odd data D5 of the third data FDIN <0:7> may be identical with that of the even data D4 of the third data FDIN <0:7>. A logic state of the odd data D7 of the third data FDIN <0:7> may be inverted from that of the even data D6 of the third data FDIN <0:7>.

FIG. 9 shows a timing diagram including an operation of a generation of the third data FDIN <0:7> having 8-bit data D0 through D7 from the first data DIN having 2-bit data D0 and D4. In FIG. 9, the data pattern select signal DPS <0:3> includes a first data pattern select signal DPS0, a second data pattern select signal DPS1, a third data pattern select signal DPS2, and a fourth data pattern select signal DPS3, and the buffered data pattern select signal BDPS <0:3> includes a first buffered data pattern select signal BDPS0, a second buffered data pattern select signal BDPS1, a third buffered data pattern select signal BDPS2, and a fourth buffered data pattern select signal BDPS3.

Referring to FIG. 9, the first buffered data pattern select signal BDPS0 is a logic "low," the second buffered data pattern select signal BDPS1 is a logic "high," the third buffered data pattern select signal BDPS2 is a logic "low," and the fourth buffered data pattern select signal BDPS3 is a logic "high." Even data D0 and D2 output from the sampler 2400 are generated from a first bit D0 of the first data DIN, and even data D4 and D6 output from the sampler 2400 are generated from a second bit D4 of the first data DIN. Each odd data D1, D3, D5 and D7 output from the sampler 2400 may be identical with corresponding even data D0, D2, D4 and D6 output from the sampler 2400.

In a test mode, a logic state of a first bit D0 of the third data FDIN <0:7> may be identical with that of the first bit D0 of the first data DIN, a logic state of a second bit D1 of the third data FDIN <0:7> may be inverted from that of the first bit D0 of the first data DIN, a logic state of a third bit D2 of the third data FDIN <0:7> may be identical with that of the first bit D0 of the first data DIN, and a logic state of a fourth bit D3 of the third data FDIN <0:7> may be inverted from that of the first bit D0 of the first data DIN. In addition, a logic state of a fifth bit D4 of the third data FDIN <0:7> may be identical with that of the second bit D4 of the first data DIN, a logic state of a sixth bit D5 of the third data FDIN <0:7> may be inverted from that of the second bit D4 of the first data DIN, a logic state of a seventh bit D6 of the third data FDIN <0:7> may be identical with that of the second bit D4 of the first data DIN, and a logic state of an eighth bit D7 of the third data FDIN <0:7> may be inverted from that of the second bit D4 of the first data DIN.

For example, the first bit D0 of the third data FDIN <0:7> may be generated from the first bit D0 of the first data DIN responsive to the first buffered data pattern select signal BDPS0, the second bit D2 of the third data FDIN <0:7> may be generated from the first bit D0 of the first data DIN responsive to the second buffered data pattern select signal BDPS1, the third bit D3 of the third data FDIN <0:7> may be generated from the first bit D0 of the first data DIN responsive to the third buffered data pattern select signal BDPS2, and the fourth bit D4 of the third data FDIN <0:7> may be generated from the first bit D0 of the first data DIN responsive to the fourth buffered data pattern select signal BDPS3. In addition, the fifth bit D4 of the third data FDIN <0:7> may be generated from the second bit D4 of the first data DIN responsive to the first buffered data pattern select signal BDPS0, the sixth bit D5 of the third data FDIN <0:7> may be generated from the second bit D4 of the first data DIN responsive to the second buffered data pattern select signal BDPS1, the seventh bit D6 of the third data FDIN <0:7> may be generated from the second bit D4 of the first data DIN responsive to the third buffered data pattern select signal BDPS2, and the eighth bit D7 of the third data FDIN <0:7> may be generated from the second bit D4 of the first data DIN responsive to the fourth buffered data pattern select signal BDPS3. In FIG. 9, the third data FDIN <0:7> may have values of D0=D0, D1=D0B, D2=D0, D31=D0B, D4=D4, D5=D4B, D6=D4, and D7=D4B.

As described above, the input circuit 2000 of the semiconductor memory device in FIG. 6 may generate various patterns of an input signal according to a logic state of the data pattern select signal DPS <0:3>. The data pattern select signal DPS <0:3> may be received through the RDQS pin 2010.

Figure 10:
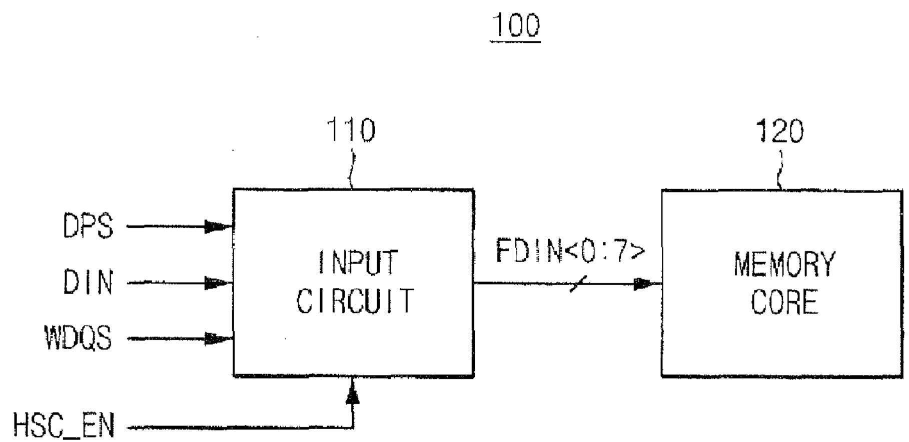
FIG. 10 shows a block diagram including a semiconductor memory device including an input circuit according to example embodiments of the present invention.

FIG. 10 shows a block diagram including a semiconductor memory device including an input circuit according to example embodiments of the present invention. Referring to FIG. 10, the semiconductor memory device 100 includes an input circuit 110 and a memory core 120.

The input circuit 110 receives a data pattern select signal DPS, first data DIN, a write DQS signal WDQS, and a test mode signal HSC_EN, and generates second data BODIN <0:7> having a plurality of bits by sampling the first data DIN responsive to the write DQS signal WDQS, and parallelizing sampled data. In addition, the input circuit 110 sets a pattern of the second data BODIN <0:7> responsive to the test mode signal HSC_EN and the data pattern select signal DPS, and generates third data FDIN <0:7>. In a normal mode, logic states of the second data BODIN <0:7> are not inverted. However, in a test mode, logic states of even data of the second data BODIN <0:7> are not inverted, but logic states of odd data of the second data BODIN <0:7> are set responsive to a buffered data pattern select signal BDPS. The memory core 120 includes memory cells. The third data FDIN <0:7> are written into the memory cells, and data stored in the memory cells are read.

Figure 11:
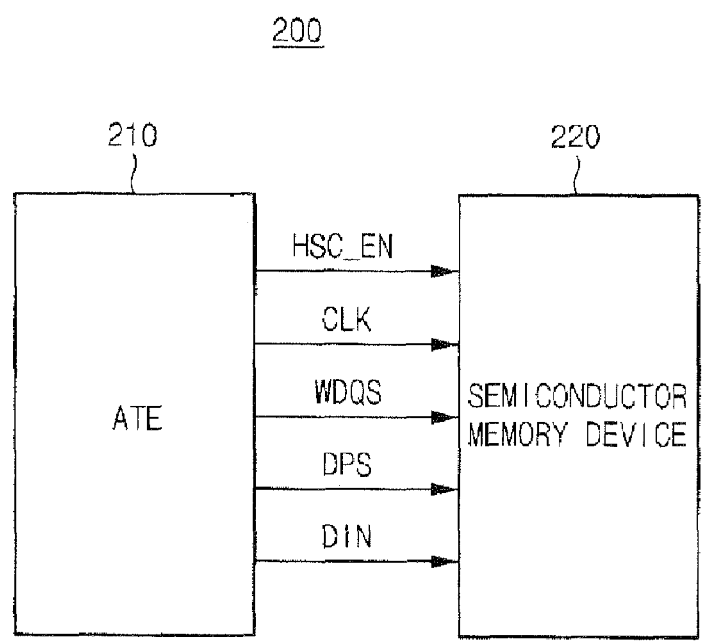
FIG. 11 shows a block diagram including a test system for testing a semiconductor memory device including an input circuit according to example embodiments of the present invention.

FIG. 11 shows a block diagram including a test system for testing a semiconductor memory device including an input circuit according to example embodiments of the present invention. Referring to FIG. 11, the test system 200 includes an automatic test device (ATE) 210 and a semiconductor memory device 220.

The ATE 210 provides a test mode signal HSC_EN, a clock signal CLK, a write DQS signal WDQS, a data pattern select signal DPS, and first data DIN to the semiconductor memory device 220, to test the semiconductor memory device 220.

The semiconductor memory device 220 generates second data BODIN <0:7> having a plurality of bits by sampling the first data DIN responsive to the write DQS signal WDQS and parallelizing sampled data. In addition, the semiconductor memory device 220 sets a pattern of the second data BODIN <0:7> responsive to the test mode signal HSC_EN and the data pattern select signal DPS, and generates third data FDIN <0:7>. In a normal mode, logic states of second data BODIN <0:7> are not inverted. However, in a test mode, logic states of even data of the second data BODIN <0:7> are not inverted, but logic states of odd data of the second data BODIN <0:7> are set responsive to a buffered data pattern select signal BDPS. In addition, the third data FDIN <0:7> are written into memory cells included in the semiconductor memory device 220, and data stored in the memory cells are read.

As mentioned above, a semiconductor memory device including an input circuit according to example embodiments of the present invention may generate data of various patterns in a test mode, and may perform a high-speed test using a low-speed tester.

While the example embodiments of the present invention and their advantages have been described in detail, it should be understood that various changes, substitutions and alterations may be made herein without departing from the scope of the invention.

What is claimed is:

1. An input circuit for a semiconductor memory device, comprising:

a data input circuit configured to receive first data, and configured to generate second data by buffering the first data, sampling the buffered first data responsive to a write data strobe (WDQS) signal, and parallelizing the sampled data; and a pattern circuit configured to modify a pattern of the second data responsive to a test mode signal and responsive to a data pattern select signal, and configured to generate third data, wherein the pattern circuit maintains a logic state of each bit of the second data to generate the third data in a normal mode, and maintains the logic state of each even data bit of the second data and sets the logic state of each odd data bit of the second data responsive to the data pattern select signal to generate the third data in a test mode.

2. The input circuit of claim 1, wherein the data pattern select signal is input through a read data strobe (RDQS) pin.

3. The input circuit of claim 1, wherein the logic state of each odd data bit of the second data is identical to that of each corresponding even data bit of the second data.

4. The input circuit of claim 1, wherein the pattern circuit comprises:

a first pattern circuit configured to generate a first bit and a second bit of the third data from a first bit and a second bit of the second data responsive to the test mode signal and the data pattern select signal;

a second pattern circuit configured to generate a third bit and a fourth bit of the third data from a third bit and a fourth bit of the second data responsive to the test mode signal and the data pattern select signal;

a third pattern circuit configured to generate a fifth bit and a sixth bit of the third data from a fifth bit and a sixth bit of the second data responsive to the test mode signal and the data pattern select signal; and a fourth pattern circuit configured to generate a seventh bit and an eighth bit of the third data from a seventh bit and an eighth bit of the second data responsive to the test mode signal and the data pattern select signal.

5. The input circuit of claim 4, wherein the first pattern circuit comprises:

a delay circuit configured to delay the first bit of the second data to generate the first bit of the third data;

an inverter configured to invert a logic state of the first bit of the second data;

a first multiplexer configured to select one of an output signal of the inverter and the first bit of the second data responsive to the data pattern select signal; and a second multiplexer configured to select one of the second bit of the second data and an output signal of the first multiplexer responsive to the test mode signal to generate the second bit of the third data.

6. The input circuit of claim 4, wherein the second pattern circuit comprises:

a delay circuit configured to delay the third bit of the second data to generate the third bit of the third data;

an inverter configured to invert a logic state of the third bit of the second data;

a first multiplexer configured to select one of an output signal of the inverter and the third bit of the second data responsive to the data pattern select signal; and a second multiplexer configured to select one of the fourth bit of the second data and an output signal of the first multiplexer responsive to the test mode signal to generate the fourth bit of the third data.

7. The input circuit of claim 4, wherein the third pattern circuit comprises:

a delay circuit configured to delay the fifth bit of the second data to generate the fifth bit of the third data;

an inverter configured to invert a logic state of the fifth bit of the second data;

a first multiplexer configured to select one of an output signal of the inverter and the fifth bit of the second data responsive to the data pattern select signal; and a second multiplexer configured to select one of the sixth bit of the second data and an output signal of the first multiplexer responsive to the test mode signal to generate the sixth bit of the third data.

8. The input circuit of claim 4, wherein the fourth pattern circuit comprises:

a delay circuit configured to delay the seventh bit of the second data to generate the seventh bit of the third data;

an inverter configured to invert a logic state of the seventh bit of the second data;

a first multiplexer configured to select one of an output signal of the inverter and the seventh bit of the second data responsive to the data pattern select signal; and a second multiplexer configured to select one of the eighth bit of the second data and an output signal of the first multiplexer responsive to the test mode signal to generate the eighth bit of the third data.

9. The input circuit of claim 1, wherein the data pattern select signal includes a first data pattern select signal having a first logic state, a second data pattern select signal having a second logic state, a third data pattern select signal having a third logic state, and a fourth data pattern select signal having a fourth logic state.

10. The input circuit of claim 9, wherein the first through fourth data pattern select signals maintains the first through fourth logic states, respectively, until every bit of the second data is output.

11. The input circuit of claim 9, wherein the first data is 4-bit data.

12. The input circuit of claim 11, wherein the pattern circuit comprises:

a first pattern circuit configured to generate a first bit and a second bit of the third data from a first bit and a second bit of the second data responsive to the test mode signal and the first data pattern select signal;

a second pattern circuit configured to generate a third bit and a fourth bit of the third data from a third bit and a fourth bit of the second data responsive to the test mode signal and the second data pattern select signal;

a third pattern circuit configured to generate a fifth bit and a sixth bit of the third data from a fifth bit and a sixth bit of the second data responsive to the test mode signal and the third data pattern select signal; and a fourth pattern circuit configured to generate a seventh bit and an eighth bit of the third data from a seventh bit and an eighth bit of the second data responsive to the test mode signal and the fourth data pattern select signal.

13. The input circuit of claim 12, wherein the first pattern circuit comprises:

a delay circuit configured to delay the first bit of the second data to generate the first bit of the third data;

an inverter configured to invert a logic state of the first bit of the second data;

a first multiplexer configured to select one of an output signal of the inverter and the first bit of the second data responsive to the first data pattern select signal; and a second multiplexer configured to select one of the second bit of the second data and an output signal of the first multiplexer responsive to the test mode signal to generate the second bit of the third data.

14. The input circuit of claim 12, wherein the second pattern circuit comprises:

a delay circuit configured to delay the third bit of the second data to generate the third bit of the third data;

an inverter configured to invert a logic state of the third bit of the second data;

a first multiplexer configured to select one of an output signal of the inverter and the third bit of the second data responsive to the second data pattern select signal; and a second multiplexer configured to select one of the fourth bit of the second data and an output signal of the first multiplexer responsive to the test mode signal to generate the fourth bit of the third data.

15. The input circuit of claim 12, wherein the third pattern circuit comprises:

a delay circuit configured to delay the fifth bit of the second data to generate the fifth bit of the third data;

an inverter configured to invert a logic state of the fifth bit of the second data;

a first multiplexer configured to select one of an output signal of the inverter and the fifth bit of the second data responsive to the third data pattern select signal; and a second multiplexer configured to select one of the sixth bit of the second data and an output signal of the first multiplexer responsive to the test mode signal to generate the sixth bit of the third data.

16. The input circuit of claim 12, wherein the fourth pattern circuit comprises:

a delay circuit configured to delay the seventh bit of the second data to generate the seventh bit of the third data;

an inverter configured to invert a logic state of the seventh bit of the second data;

a first multiplexer configured to select one of an output signal of the inverter and the seventh bit of the second data responsive to the fourth data pattern select signal; and a second multiplexer configured to select one of the eighth bit of the second data and an output signal of the first multiplexer responsive to the test mode signal to generate the eighth bit of the third data.

17. The input circuit of claim 9, wherein the first data is 2-bit data.

18. The input circuit of claim 1, wherein the data input circuit comprises:

a data input buffer configured to buffer the first data to generate the buffered first data;

a WDQS input buffer configured to buffer a WDQS signal to generate a first WDQS signal;

a sampler configured to sample the buffered first data responsive to the first WDQS signal, and configured to generate even data and odd data;

a delay circuit configured to delay the first WDQS signal to generate a second WDQS signal;

an ordering circuit configured to parallelize the even data and the odd data responsive to the second WDQS signal, and configured to determine an order of the parallelized data; and an RDQS input buffer configured to buffer the data pattern select signal to provide a buffered data pattern select signal to the pattern circuit.

19. A semiconductor memory device comprising:

an input circuit configured to receive first data, to generate second data having a plurality of bits by sampling the first data, to parallelize the sampled data responsive to a write data strobe (WDQS) signal, to modify a pattern of the second data responsive to a test mode signal and responsive to a data pattern select signal, and to generate third data; and a memory core including a memory cell array configured to write and configured to read the third data, wherein the input circuit maintains a logic state of each bit of the second data to generate the third data in a normal mode, and maintains the logic state of each even data bit of the second data and sets the logic state of each odd data bit of the second data responsive to the data pattern select signal to generate the third data in a test mode.

20. The semiconductor memory device of claim 19, wherein the input circuit comprises:

a data input circuit configured to generate the second data by buffering the first data, sampling the buffered first data responsive to the WDQS signal, and parallelizing the sampled data; and a data pattern setting circuit configured to modify the pattern of the second data responsive to the test mode signal and responsive to the data pattern select signal to generate the third data.

21. The semiconductor memory device of claim 20, wherein the input circuit further comprises an RDQS input buffer configured to buffer the data pattern select signal to provide a buffered data pattern select signal to the data pattern setting circuit.

22. The semiconductor memory device of claim 19, wherein the data pattern select signal is input through a read data strobe (RDQS) pin.

23. A test system for a semiconductor memory device, comprising:

a semiconductor memory device configured to receive first data, to generate second data having a plurality of bits by sampling the first data responsive to a write data strobe (WDQS) signal, to parallelize the sampled data, to modify a pattern of the second data responsive to a test mode signal and responsive to a data pattern select signal, to generate third data, and to apply the third data to a memory cell array of the semiconductor memory device; and a tester configured to provide the test mode signal, the WDQS signal, the data pattern select signal, and the first data to the semiconductor memory device, wherein the semiconductor memory device maintains a logic state of each bit of the second data to generate the third data in a normal mode, and maintains the logic state of each even data of the second data and sets the logic state of each odd data of the second data responsive to the data pattern select signal to generate the third data in a test mode.

24. The test system of claim 23, wherein the data pattern select signal is input through a read data strobe (RDQS) pin.

25. A semiconductor test system, comprising:

a test device configured to output a plurality of signals; and a semiconductor memory device, comprising:

a memory core including a memory cell array; and an input circuit configured to receive at least some of the plurality of signals, comprising:

a sampler configured to sample at least one of the plurality of signals by generating a plurality of even data bits and a plurality of odd data bits;

an ordering circuit configured to parallelize the sampled signals by ordering the even data bits and the odd data bits; and a pattern circuit configured to generate a data pattern responsive to at least another one of the plurality of signals by inverting at least some or one of the odd or even data bits, wherein the pattern circuit inverts the at least some or one of the odd or even data bits by maintaining a logic state of each even data bit and setting a logic state of each odd data bit.

26. The test system of claim 25, wherein the at least another one of the plurality of signals includes a test mode signal to indicate a test mode.

27. The test system of claim 26, wherein the plurality of signals further includes:

a write data strobe signal;

at least one data signal;

at least one data path select signal; and a clock signal configured to synchronize the write data strobe signal to one of a same frequency of the clock signal and twice a frequency of the clock signal.

28. The test system of claim 27, wherein the sampler is configured to generate the plurality of even data bits and the plurality of odd data bits responsive to the write data strobe signal.

29. The test system of claim 28, wherein the ordering circuit is configured to order the plurality of even data bits and the plurality of odd data bits responsive to the write data strobe signal, and configured to generate a plurality of data output signals.

30. The test system of claim 29, wherein the pattern circuit is configured to receive the data output signals from the ordering circuit, and configured to invert at least some of the data output signals responsive to the test mode signal.

31. The test system of claim 28, wherein a first of the plurality of odd data bits has a logic state of a first of the plurality of even data bits, a second of the plurality of odd data bits has an inverted logic state of a second of the plurality of even data bits, a third of the plurality of odd data bits has a logic state of a third of the plurality of even data bits, and a fourth of the plurality of odd data bits has an inverted logic state of a fourth of the plurality of even data bits.

32. The test system of claim 28, wherein a first of the plurality of odd data bits has an inverted logic state of a first of the plurality of even data bits, a second of the plurality of odd data bits has a logic state of a second of the plurality of even data bits, a third of the plurality of odd data bits has an inverted logic state of a third of the plurality of even data bits, and a fourth of the plurality of odd data bits has a logic state of a fourth of the plurality of even data bits.

33. The test system of claim 28, wherein a first of the plurality of odd data bits has an inverted logic state of a first of the plurality of even data bits, a second of the plurality of odd data bits has an inverted logic state of the first of the plurality of even data bits, no odd data bits have a logic state of a second of the plurality of even data bits, a third of the plurality of odd data bits has an inverted logic state of a third of the plurality of even data bits, a fourth of the plurality of odd data bits has the inverted logic state of the third of the plurality of even data bits, and no odd data bits have a logic state of a fourth of the plurality of even data bits.

34. A method for testing a semiconductor memory device, comprising:

receiving a plurality of signals;

sampling at least one of the plurality of signals by generating a plurality of even data bits and a plurality of odd data bits;

parallelizing the sampled signals by ordering the even data bits and the odd data bits; and generating a data pattern by inverting at least some or one of the odd or even data bits, wherein inverting the at least some or one of the odd or even data bits includes maintaining a logic state of each even data bit and setting a logic state of each odd data bit responsive to a data pattern select signal.

35. The method of claim 34, wherein the data pattern is written to a memory core at twice a frequency of a clock signal.

36. The method of claim 35, wherein the data pattern is read from the memory core at twice the frequency of the clock signal.

37. The method of claim 34, wherein inverting the at least some of one of the odd or even data bits includes setting a first of the plurality of odd data bits to a logic state of a first of the plurality of even data bits, setting a second of the plurality of odd data bits to an inverted logic state of a second of the plurality of even data bits, setting a third of the plurality of odd data bits to a logic state of a third of the plurality of even data bits, and setting a fourth of the plurality of odd data bits to an inverted logic state of a fourth of the plurality of even data bits.

38. The method of claim 34, wherein inverting the at least some of one of the odd or even data bits includes setting a first of the plurality of odd data bits to an inverted logic state of a first of the plurality of even data bits, setting a second of the plurality of odd data bits to a logic state of a second of the plurality of even data bits, setting a third of the plurality of odd data bits to an inverted logic state of a third of the plurality of even data bits, and setting a fourth of the plurality of odd data bits to a logic state of a fourth of the plurality of even data bits.

39. The method of claim 34, wherein inverting the at least some of one of the odd or even data bits includes setting a first of the plurality of odd data bits to an inverted logic state of a first of the plurality of even data bits, setting a second of the plurality of odd data bits to an inverted logic state of the first of the plurality of even data bits, not setting any odd data bits to a logic state of a second of the plurality of even data bits, setting a third of the plurality of odd data bits to an inverted logic state of a third of the plurality of even data bits, setting a fourth of the plurality of odd data bits to the inverted logic state of the third of the plurality of even data bits, and not setting any odd data bits to a logic state of a fourth of the plurality of even data bits.

* * * * *

UNITED STATES PATENT AND TRADEMARK OFFICE

CERTIFICATE OF CORRECTION

PATENT NO. : 7,587,645 B2
APPLICATION NO. : 11/690092
DATED : September 8, 2009
INVENTOR(S) : Young-Uk Chang et al.

It is certified that error appears in the above-identified patent and that said Letters Patent is hereby corrected as shown below:

Column 8, line 50, the word "PDTN_F" should read -- PDIN_F --.

Signed and Sealed this

Twenty-second Day of December, 2009

David J. Kappos

*Director of the United States Patent and Trademark Office*